United States Patent
Agnello et al.

(10) Patent No.: US 6,809,030 B2
(45) Date of Patent: *Oct. 26, 2004

(54) METHOD AND STRUCTURE FOR CONTROLLING THE INTERFACE ROUGHNESS OF COBALT DISILICIDE

(75) Inventors: Paul David Agnello, Wappingers Falls, NY (US); Cyril Cabral, Jr., Ossining, NY (US); Roy Arthur Carruthers, Stormville, NY (US); James McKell Edwin Harper, Yorktown Heights, NY (US); Christian Lavoie, Ossining, NY (US); Kirk David Peterson, Essex Junction, VT (US); Robert Joseph Purtell, Mohegan Lake, NY (US); Ronnen Andrew Roy, Ossining, NY (US); Jean Louise Jordan-Sweet, Shoreham, NY (US); Yun Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

This patent is subject to a terminal disclaimer.

(21) Appl. No.: 10/185,547

(22) Filed: Jun. 28, 2002

(65) Prior Publication Data

US 2002/0182836 A1 Dec. 5, 2002

Related U.S. Application Data

(62) Division of application No. 09/416,083, filed on Oct. 12, 1999, now Pat. No. 6,440,851.

(51) Int. Cl.[7] .............................................. H01L 21/44
(52) U.S. Cl. ...................... 438/682; 438/655; 438/656
(58) Field of Search .................................. 438/558, 597, 438/602, 630, 649, 655, 658–660, 663, 664, 682–86

(56) References Cited

U.S. PATENT DOCUMENTS

| | | | |
|---|---|---|---|
| 5,510,295 A | 4/1996 | Cabral, Jr. et al. | |
| 5,608,226 A | 3/1997 | Yamada et al. | |
| 5,624,869 A | 4/1997 | Agnello et al. | |
| 5,828,131 A | 10/1998 | Cabral, Jr. et al. | |

OTHER PUBLICATIONS

M. Lawrence, et al.,(1991),"Growth of Epitaxial CoSi2 on (100)Si," Appl. Phys. Lett., vol. 58, No. 12, pp. 1308–1310.
C. Cabral, Jr., et al.,(1995),"In–Situ X Ray Diffractin and Resistivity Analysis of CoSi2 Phase Formation With and Without a Ti Interlayer at Rapid Thermal Annealing Rates," Mat. Res. Sco. Symp. Proc., vol. 375, pp. 253–258.

*Primary Examiner*—Nathan J. Flynn
*Assistant Examiner*—Leonardo Andújar
(74) *Attorney, Agent, or Firm*—Scully, Scott, Murphy & Presser; Robert M. Trepp

(57) ABSTRACT

A method of producing electrical contacts having reduced interface roughness as well as the electrical contacts themselves are disclosed herein. The method of the present invention comprises (a) forming an alloy layer having the formula MX, wherein M is a metal selected from the group consisting of Co and Ni and X is an alloying additives over a silicon-containing substrate; (b) optionally forming an optional oxygen barrier layer over said alloy layer; (c) annealing said alloy layer at a temperature sufficient to form a MXSi layer in said structure; (d) removing said optional oxygen barrier layer and any remaining alloy layer; and optionally (e) annealing said MXSi layer at a temperature sufficient to form a MXSi$_2$ layer in said structure.

9 Claims, 9 Drawing Sheets

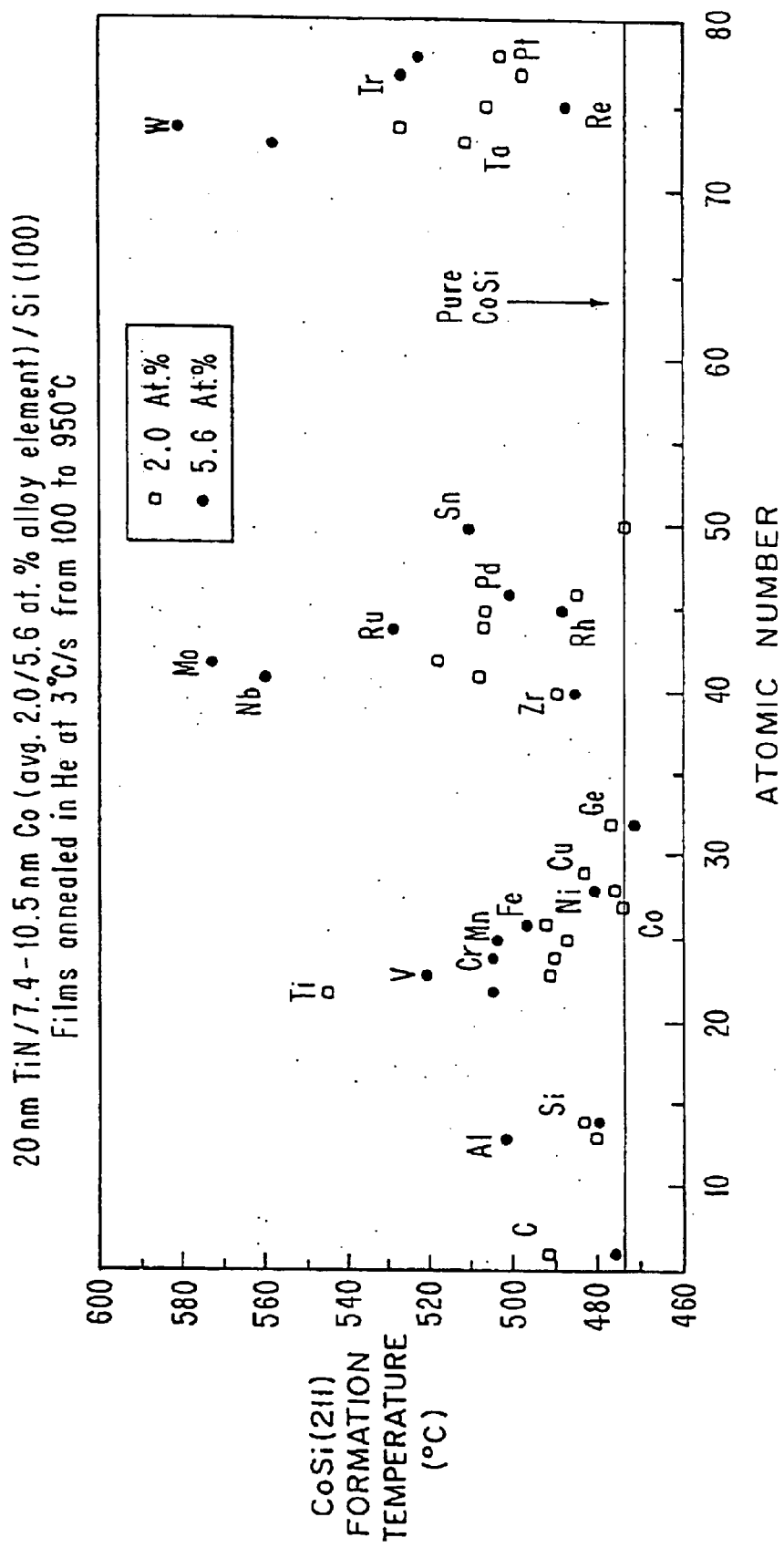

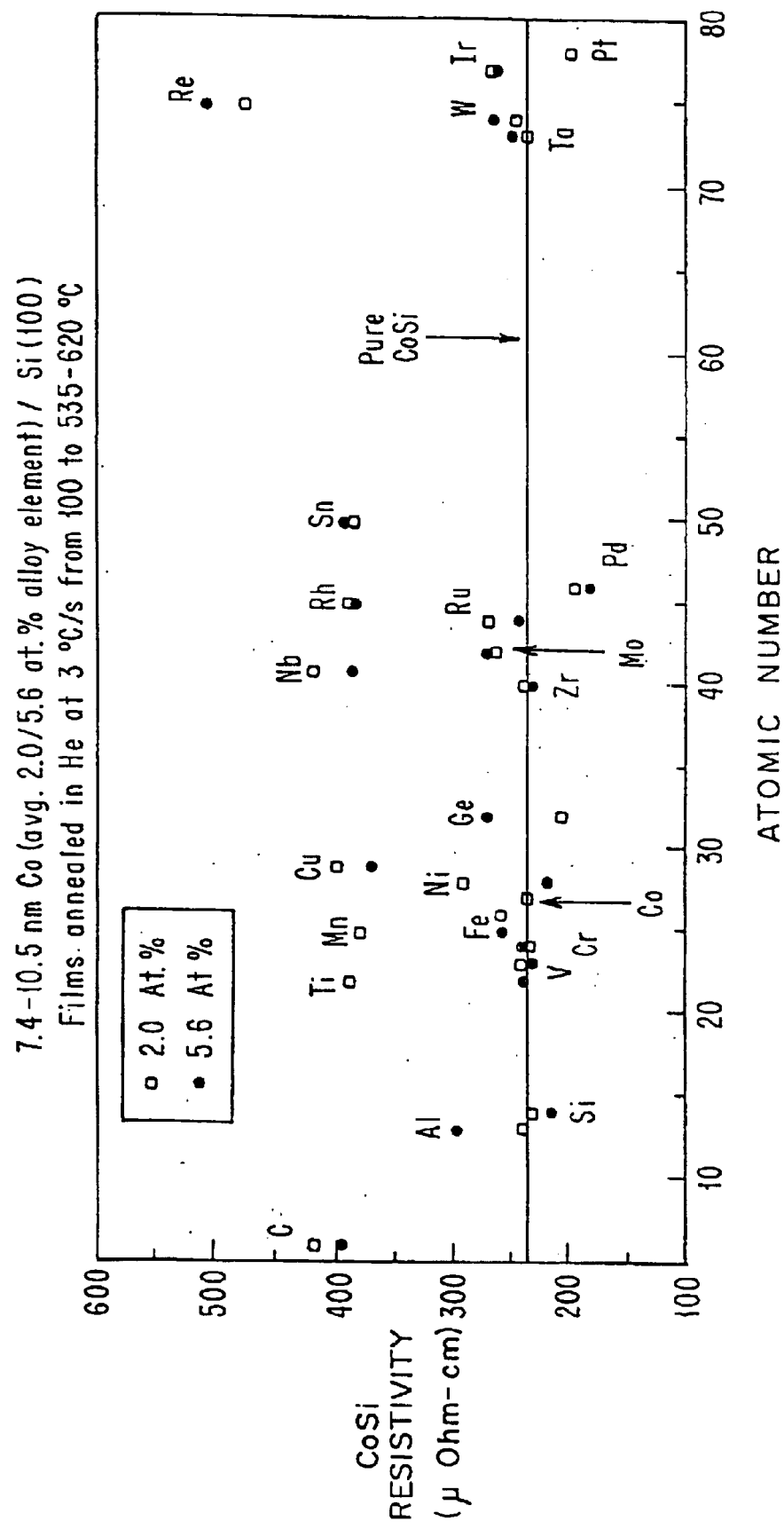

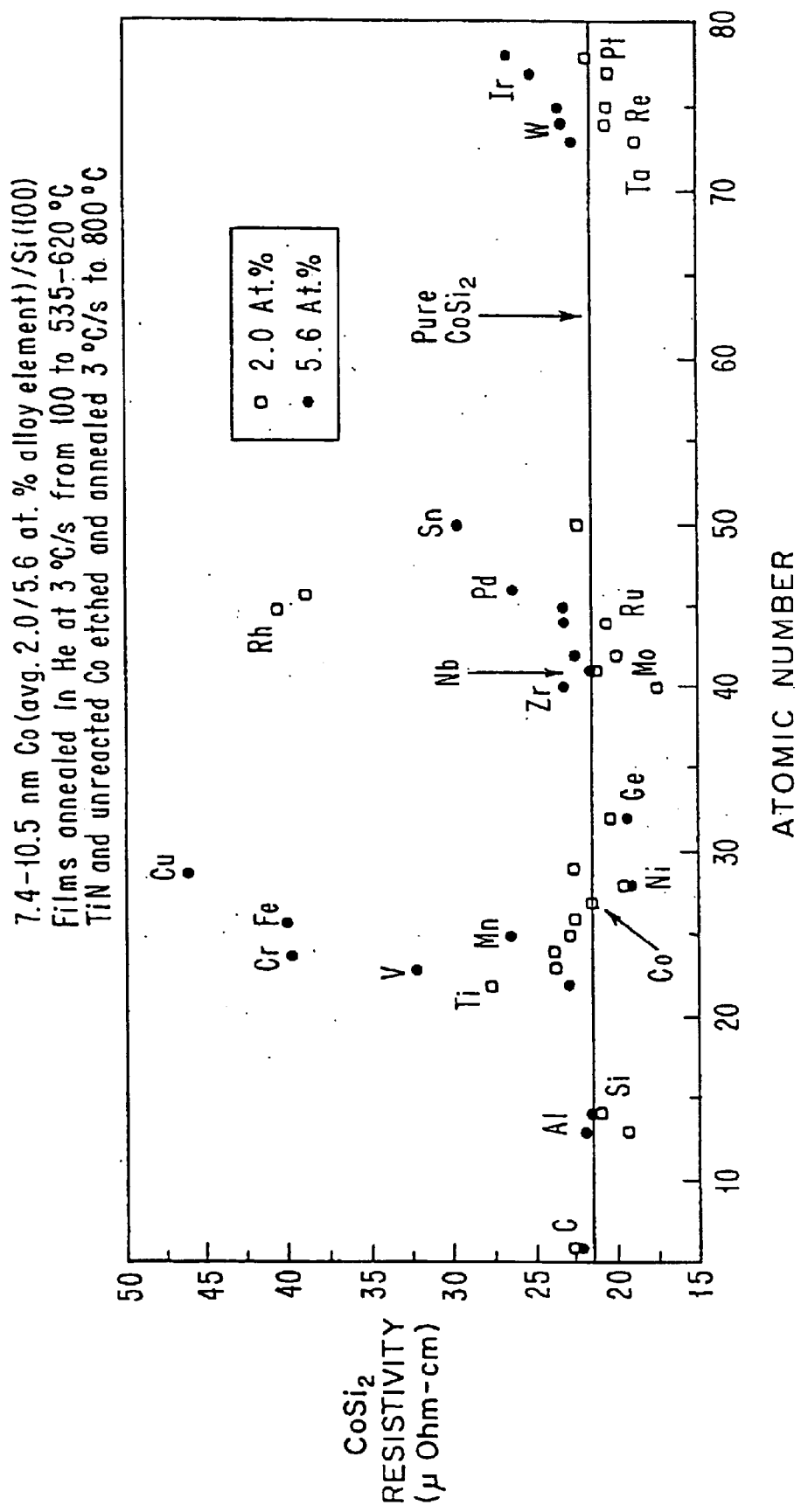

METHOD AND STRUCTURE FOR CONTROLLING THE INTERFACE ROUGHNESS OF COBALT DISILICIDE

This application is a divisional of U.S. application Ser. No. 09/416,083 filed on Oct. 12, 1999, now U.S. Pat. No. 6,440,851.

FIELD OF THE INVENTION

The present invention relates to semiconductor transistor manufacturing, and more particularly to a method for controlling the interface roughness of a low resistivity electrical contact, wherein a Co or Ni alloy is employed in forming the electrical contact.

BACKGROUND OF THE INVENTION

The low resistivity and the ease of formation have made cobalt disilicide a suitable choice as the contact material to the source, drain and gate of a transistor in ultra-large scale integration (ULSI). The main drawbacks of using cobalt disilicide over the more widely used titanium disilicide reside in an increase in junction leakage and a higher sensitivity to oxygen. It is an accepted principle that the increased junction leakage is caused by the roughness of the interface between the disilicide and the Si-containing substrate.

In the self-aligned silicide (salicide) process, a blanket TiN/Co film is deposited over the devices and annealed to form cobalt monosilicide over the exposed Si regions (source, drain and gate) of the transistor. A selective wet etch process is used to remove the TiN cap and any non-reacted cobalt left over in the oxide or nitride regions. The cobalt monosilicide is then further annealed to form cobalt disilicide.

The leakage observed during electrical testing is at least partially a consequence of disilicide spikes that extend into the silicon and through the junction. Since the silicide is formed by a reactive diffusion mechanism, roughening is expected at the formation of each of the silicide phases. Presently, it is not known which of the annealing stages contribute to the formation of the most damaging interface roughness. The first phase forms a metal rich $Co_2Si$ phase during which cobalt is the main diffusing element. This phase is followed closely in temperature by formation of the monosilicide (CoSi) during which silicon is the dominant diffusing species. At higher temperature, cobalt diffusion is mainly responsible for the formation of the disilicide ($CoSi_2$).

SUMMARY OF THE INVENTION

Although not known, it is believed by the applicants of the present application that the area leakage problem described above originates from a non-uniform diffusion of Co into the silicon during formation of the silicide. This could occur during the formation of either the $Co_2Si$ phase or the $CoSi_2$ phase since these two phases are formed by diffusion of Co. In the formation of $CoSi_2$, the grains in the preceding monosilicide are fairly uniform with an average grain size on the order of the film thickness. Considering that the distance between the spikes of $CoSi_2$ into Si is much larger than the film thickness, it is unlikely that a film with a uniform, small microstructure can lead to such a highly non-uniform diffusion. The formation of $Co_2Si$, however, originates from the pure cobalt layer and the silicon single crystal. The cobalt layer can exhibit large variations in microstructure including different possible crystal structures.

Through extensive studies, applicants propose herein that the damaging interface roughness is a consequence of non-uniformities in the cobalt layer that develop in the first part of the anneal before silicidation. These non-uniformities are believed to be enhanced at each subsequent annealing step. In the present invention, applicants have determined that by controlling the Co microstructure, it is possible to tailor the properties of the interface between the silicon and the cobalt disilicide.

It is known that the hcp-phase (hexagonal close packed) of Co can show abnormal grain growth in which only the (002) grains expand laterally to a size many times larger than the film thickness while the other grains remain much smaller. A considerable stress reduction in the cobalt layer is observed during this abnormal grain growth which could be the driving force for the non-uniformities. Such large grains could be the source of spiking since it is easier for the cobalt to diffuse from triple junctions or grain boundaries. The grain growth can also be followed by a spatially non-uniform phase transformation of the cobalt from the hcp phase to the fcc (face centered cubic) phase. The simultaneous presence of the two Co phases at the beginning of the silicide formation could in itself lead to enhanced non-uniformity in the diffusion of Co. The fact that impurities in the film have different miscibility in these two Co phases could add to the non-uniformity by selectively hindering the diffusion of Co. The non-uniformity could arise from either precipitation of impurities during the Co transformation or impurities going into solution. For example, the formation of cobalt silicide is highly sensitive to oxygen and the solubility of the oxygen in the cobalt, although very small, is four times larger for the hcp phase as compared with the fcc phase.

The above problems are solved by utilizing the method of the present invention which comprises the steps of:

(a) forming an alloy layer having the formula MX over a silicon-containing substrate, wherein M is a metal selected from the group consisting of Co and Ni and X is an alloying additive;

(b) optionally forming an oxygen barrier layer over said alloy layer;

(c) annealing said alloy layer at a temperature which is effective in forming a MXSi layer; and (d) removing said optional oxygen barrier layer and any remaining alloy layer.

In an optional embodiment of the present invention, a pre-annealing step is carried out between steps (a) and (c) or (b) and (c) at an annealing temperature which is sufficient to form a $M_2XSi$ layer in the structure. Typically, the pre-annealing step is carried out at a temperature that is lower than the temperature used in forming the MXSi layer.

It is noted that when a Co alloy is employed, a second annealing step follows the first annealing step described in (c) above to convert the CoXSi layer into a $CoXSi_2$. Specifically, the second annealing step is carried out at a temperature that is greater than the temperature used to form the MXSi, i.e. monosilicide, layer.

It is noted that the terms $M_2XSi$; MXSi and $MXSi_2$ are not used herein as empirical formulas. Rather the terms describe the following silicide phases:

$M_2XSi$: metal rich alloy silicide phase.
MXSi: metal alloy monosilicide phase.
$MXSi_2$: metal alloy disilicide phase.

Another aspect of the present invention relates to electrical contacts that are formed utilizing the method of the present invention. In accordance with one aspect of the present invention, an electrical contact to a region of a silicon-containing substrate is provided that comprises:

- a substrate having an exposed region of a silicon-containing semiconductor material, said silicon-containing semiconductor material being doped with an impurity to provide carriers of holes, electrons or both holes and electrons; and
- a first layer of CoXSi$_2$ (Co alloy disilicide phase) wherein X is an alloying additive, said alloying additive being present in said first layer in an amount of from about 0.01 to about 50 atomic %,
- said first layer and said silicon-containing semiconductor material forming an interface having a predetermined roughness and being substantially free of Co silicide spikes descending into said silicon-containing semiconductor material.

In the case when Ni alloys are used in forming the electrical contact, the electrical contact comprises:

- a substrate having an exposed region of a silicon-containing semiconductor material, said silicon-containing semiconductor material being doped with an impurity to provide carriers of holes, electrons or both holes and electrons; and
- a first layer of NiXSi (Ni alloy monosilicide phase), wherein X is an alloying additive, said alloying additive being present in said first layer in an amount of from about 0.01 to about 50 atomic %,
- said first layer and said silicon-containing semiconductor material forming an interface having a predetermined roughness and being substantially free of Ni silicide spikes descending into said silicon-containing semiconductor material.

BRIEF DESCRIPTION OF THE DRAWINGS

FIGS. 4a–b are graphs illustrating (a) monosilicide formation temperature and (b) disilicide formation temperature for twenty-three alloys.

FIGS. 5a–b are graphs illustrating (a) resistivity of Co alloy monosilicide; and (b) resistivity of Co alloy disilicide for twenty-three alloys.

DETAILED DESCRIPTION OF THE PRESENT INVENTION

Figure 1A:
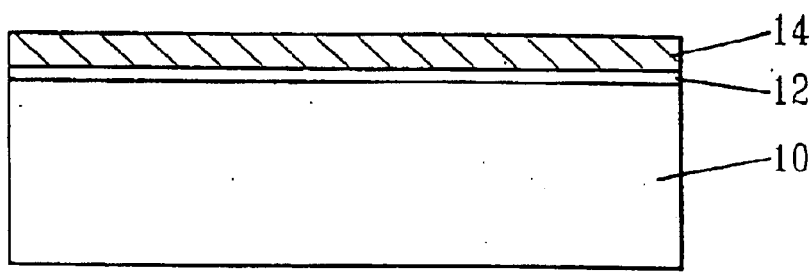
FIGS. 1a–f are cross-sectional views illustrating the basic processing steps that are employed in the present invention in forming the electrical contact.

The present invention, which is directed to a method and structure for controlling the interface roughness of the silicide phase (monosilicide or disilicide), will now be described in greater detail by referring to the drawings. that accompany the present application. It is noted that in the accompanying drawings like reference numerals are used for describing like and/or corresponding elements of the drawings.

Reference is first made to FIGS. 1a–f which illustrate the basic processing steps of the present invention that are capable of forming a structure in which the interface roughness of the silicide layer has been significantly reduced. Specifically, the structure shown in FIG. 1a comprises a Si-containing substrate 10 which has an alloy layer 14 formed thereon. The Si-containing substrate includes an oxide layer 12 that is present near the surface of the Si-containing substrate; the oxide layer forms an interface between the alloy layer and the Si-containing substrate. Suitable Si-containing substrates that can be used herein include, but are not limited to: single crystal Si, polycrystalline Si, SiGe, amorphous Si, silicon-on-insulator (SOI) and other like Si-containing materials. Typically, the SiO$_2$ layer has a thickness of from about 0.1 to about 3.0 nm.

In one embodiment of the present invention, oxide layer 12 is completely removed from the structure prior to employing the method of the present invention. In this embodiment, HF may be used to completely remove the oxide layer from the structure prior to forming the alloy layer thereon.

The Si-containing substrate may be doped or undoped and it may contain various isolation and device regions therein. These regions are not shown in the drawings but are nevertheless intended to be included in region 10.

The alloy layer is formed on the surface of substrate 10 (over oxide layer 12) using conventional deposition processes that are well known to those skilled in the art. For example, the alloy layer may be formed by chemical vapor deposition, plasma-assisted chemical vapor deposition, evaporation, sputtering and other like deposition processes. Of these techniques, it is preferred to form the alloy layer by sputtering.

The alloy layer of the present invention comprises at least one metal selected from the group consisting of Co and Ni. That is, layer 14 may comprise a Co alloy or a Ni alloy. Of these alloys, it is preferred that the alloy comprise a Co alloy. The alloy layer of the present invention may also include 0.01 to 50 atomic % of at least one additive, said at least one additive being selected from the group consisting of C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb and Lu. Mixtures of one or more of these additives are also contemplated herein. More preferably, the additive is present in the alloy layer in an amount of from about 0.1 to about 20 atomic %. Of the above mentioned additives, C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir or Pt are preferred in the present invention. The most preferred alloys are Si, Ti, V, Cr, Ni, Ge, Nb, Rh, Ta, Re or Ir.

The term "alloy" is used herein to include Co or Ni compositions that have a uniform or non-uniform distribution of said additive therein; Co or Ni compositions having a gradient distribution of said additive therein; or mixtures and compounds thereof. It should be appreciated that when a Co alloy is employed, the additive cannot be Co. Likewise, when a Ni alloy is employed, the additive cannot be Ni.

Figure 1B:
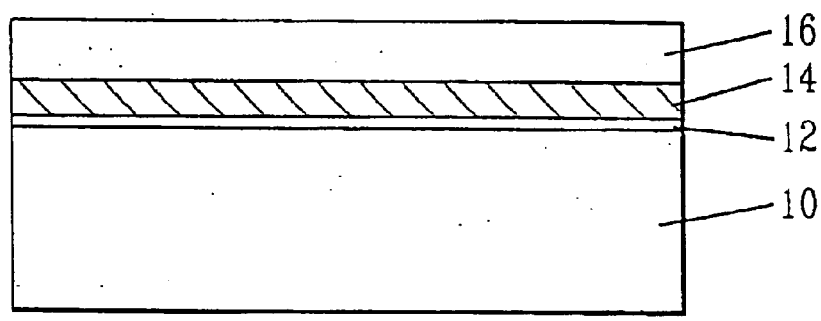

Next, as shown in FIG. 1b, an optional oxygen barrier layer 16 may be formed on the surface of alloy layer 14. The optional oxygen barrier layer is formed using conventional deposition processes that are well known to those skilled in the art. Illustrative examples of suitable deposition processes that can be employed in the present invention in forming the optional oxygen barrier layer include, but are not limited to: chemical vapor deposition, plasma-assisted chemical vapor deposition, sputtering, evaporation, plating, spin-on coating and other like deposition processes. The thickness of the optional oxygen barrier layer is not critical to the present invention as long as the oxygen barrier layer is capable of preventing oxygen or another ambient gas from diffusing into the structure. Typically, the optional oxygen barrier layer has a thickness of from about 10 to about 30 nm.

The optional oxygen barrier is composed of conventional materials that are well known in the art for preventing oxygen from diffusing into the structure. For example, TiN, $Si_3N_4$, TaN and other like material can be employed as the oxygen barrier layer. Although the drawings of the present invention show the presence of the optional barrier layer, it is possible to use the method of the present invention in cases wherein the optional barrier layer is not present.

Figure 1C:
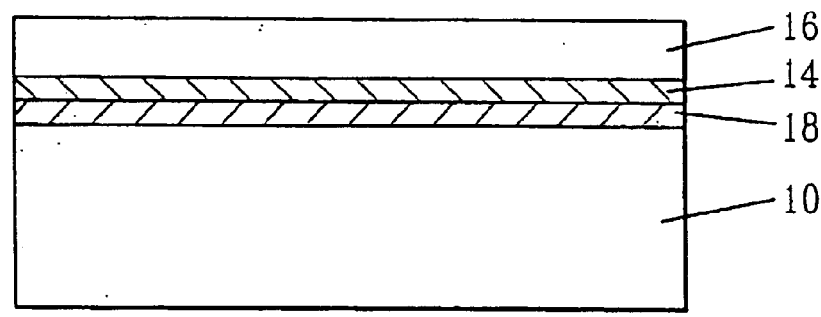

The structure shown in FIG. 1b may optionally be pre-annealed under conditions that are sufficient in forming a $M_2XSi$ (metal rich alloy silicide phase) layer 18 in the structure (See FIG. 1c). Pre-annealing is carried out using a rapid thermal anneal (RTA) process. Typically, the optional pre-annealing step is carried out in a gas atmosphere, e.g. He, Ar, $N_2$ or a forming gas, at a temperature of from about 350° to about 450° C. for a time period of from about 10 to about 300 seconds using a continuous heating regime or a ramp and soak heating regime. Other temperatures and times are also contemplated herein so long as the conditions chosen are capable of forming the $M_2XSi$ layer in the structure.

Figure 1D:
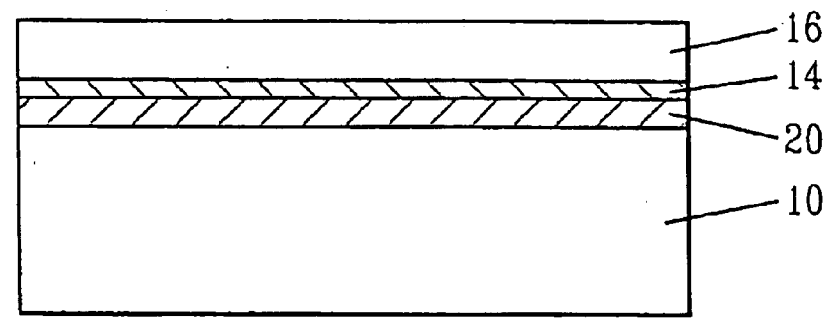
Figure 1E:
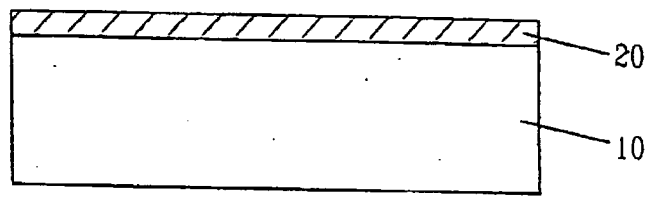

In accordance with the next step of the present application, See FIG. 1d, an annealing step is carried out on the structure shown in FIG. 1b or optionally FIG. 1c so as to form a MXSi (metal alloy silicide) layer 20 in the structure. To form the monosilicide layer in the structure, annealing is carried out using a rapid thermal anneal (RTA) process using a gas atmosphere, e.g. He, Ar, Ne or forming gas, at a temperature of from about 400° to about 700°0 C. for a time period of from about 10 to about 300 seconds using a continuous heating regime or a ramp and soak heating regime. Other temperatures and times are also contemplated herein so long as the conditions chosen are capable of forming the monosilicide, MXSi, layer 20 in the structure. It is noted that when the optional pre-annealing step is employed, the annealing temperatures used in the formation of the monosilicide layer are higher than the pre-annealing temperatures.

After the monosilicide annealing step, optional oxygen diffusion barrier 16 and any remaining alloy layer 14 is removed from the structure (See, FIG. 1e) using conventional etching techniques that are well known to those skilled in the art. For example, any wet etch process may be used in removing the optional oxygen barrier layer and the alloy layer from the structure. The chemical etchant employed in the wet etch process must be highly selective in removing the oxygen barrier layer and the alloy layer as compared to the monosilicide layer. A suitable etchant that can be employed in the present invention is a mixture of hydrogen peroxide and nitric or sulfuric acid. Other chemical etchants can also be employed in the present invention.

It is also within the contemplation of the present invention to use a dry etch process in removing the optional oxygen barrier layer and any remaining alloy layer from the structure. Suitable dry etching techniques that can be used herein include, but are not limited to: reactive-ion etching, ion beam etching, plasma etching and other like dry etching techniques.

Figure 1F:
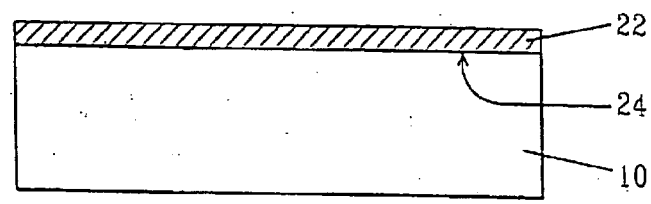

When a Ni alloy is employed, an electrical contact is formed after the monosilicide anneal and the subsequent removal step. When a Co alloy is employed, further annealing is required which converts the Co monosilicide into a Co disilicide. The disilicide annealing step is carried out at a temperature that is higher than the temperature used in either the pre-anneal or monosilicide anneal. The disilicide annealing step is thus carried out under conditions that are effective in converting the monosilicide layer, layer 20, into a disilicide layer 22, i.e. a $MXSi_2$ layer. This annealing step is also carried out by RTA using a gas ambient. Typically, the disilicide annealing step is carried out at a temperature of from about 700° to about 900° C. for a time period of from about 10 to about 300 seconds using a continuous heating regime or a ramp and soak heating regime. Other temperatures and times are also contemplated herein so long as the conditions chosen are higher than the pre-anneal and the monosilicide anneal steps so that the disilicide layer is formed in the structure. The resultant structure that is obtained using the disilicide annealing step of the present invention is shown in FIG. 1f.

It is noted that if substrate 10 was not previously doped, it can be doped after the monosilicide or the disilicide annealing steps using conventional techniques well known to those skilled in the art.

The electrical contact of the present invention thus comprises:

a substrate 10 having an exposed region of a silicon-containing semiconductor material, said silicon-containing semiconductor material being doped with an impurity to provide carriers of holes, electrons or both holes and electrons; and a first layer of $CoXSi_2$ (22), wherein X is an alloying additive, said alloying additive being present in said first layer in an amount of from about 0.01 to about 50 atomic %. Additionally, the electrical contact includes an interface 24 between disilicide layer 22 and said silicon-containing semiconductor material having a predetermined roughness and being substantially free of Co silicide spikes descending into said silicon-containing semiconductor material.

When a Ni alloy is used, the electrical contact comprises a substrate 10 having an exposed region of a silicon-containing semiconductor material, said silicon-containing semiconductor material being doped with an impurity to provide carriers of holes, electrons or both holes and electrons; and a first layer of NiXSi, wherein X is an alloying additive, said alloying additive being present in said first layer in an amount of from about 0.01 to about 50 atomic %. Additionally, the electrical contact includes an interface 24 between the silicide layer and said silicon-containing semiconductor material having a predetermined roughness and being substantially free of Ni silicide spikes descending into said silicon-containing semiconductor material.

It should be understood that by utilizing the alloy layer of the present invention one can tailor and/or control the temperature of formation of the various silicide phases (mon- or disilicide).

The present example is given to illustrate the present invention and to demonstrate some of the advantages that can arise therefrom.

EXAMPLE

The present example illustrates the advantages that can be obtained by using the method of the present invention. Specifically, in this example, studies were performed using Co alloys that contain various alloying additives. For each of the Co alloys studied, various alloy concentrations were sputtered on Si(100) substrates.

In-situ X-ray Diffraction

Figure 2A:
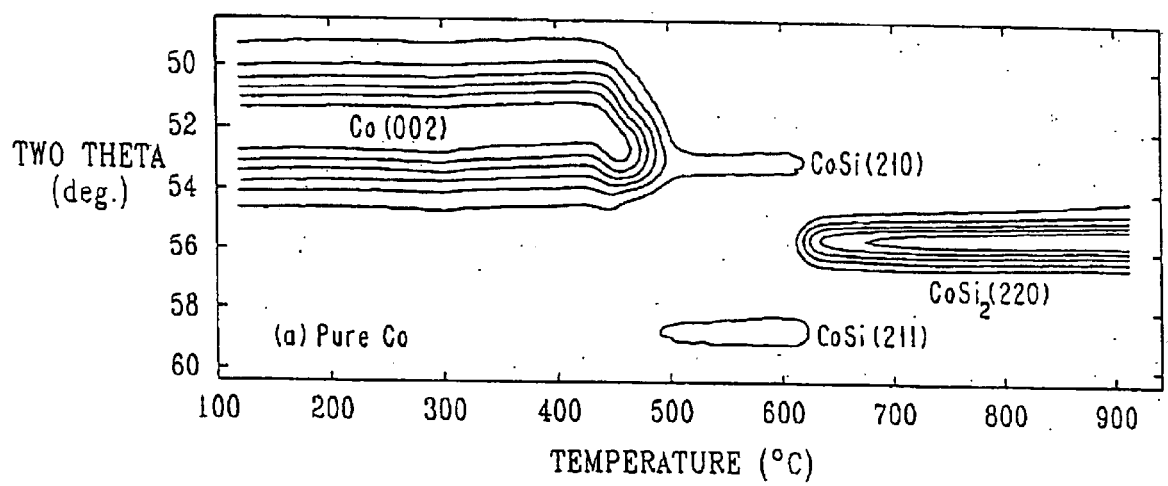
FIGS. 2a–b are in-situ X-Ray Diffraction contour plots taken during annealing of (a) 20 nm TiN/8 nm Co/Si (100)—Prior Art—; and (b) 20 nm TiN/8 nm of Co with 10 atomic % Ge/Si (100)—Invention—.
Figure 2B:
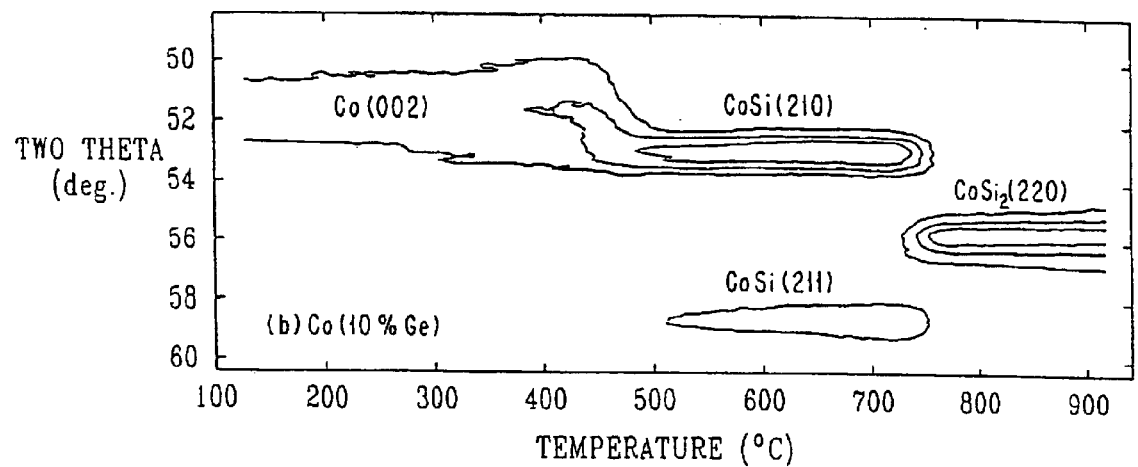

In this technique, a bright x-ray source is coupled with an annealing chamber and a fast position sensitive detector that covers an angular range of 10 degrees. This arrangement permits one to follow the evolution of the x-ray spectra during annealing and determine the formation temperatures of various phases. FIGS. 2a–b show a comparison from a pure cobalt film of 8 nm in thickness (FIG. 2a) compared with the anneal of a Co(10 atomic % Ge) film nominally containing the same amount of cobalt (FIG. 2b). The anneals were performed in purified He at 3° C./sec. The contour plots represent the x-ray intensity as a function of temperature (x axis) and 2theta diffraction angle (y axis) for the selected x-ray energy of 6.9 keV.

In FIG. 2a, the Co(002) peak seen around 52°2θ, can be followed in temperature up to about 450° C. The shift to larger angles of this peak as the temperature further increases is a consequence of the formation of the metal rich cobalt silicide ($Co_2Si$). The monosilicide then follows around 475° C., as indicated by the presence of the CoSi (210) and CoSi(211) peaks, and is present until about 625° C. when the (220) orientation of $CoSi_2$ appears. All the peaks observed here are also present when adding 10 atomic % of Ge to the cobalt (FIG. 2b). Their intensities are however much lower. For example, the $CoSi_2$ peak is more than 10 times larger in the pure cobalt case and the Co (002) peak in the CoGe case is hardly observable. Thus, addition of 10 atomic % Ge to the Co reduced the texture (preferential orientation of the grains of the film) of both the initial Co and the final $CoSi_2$. It is interesting to note that the intensities of the monosilicide peaks are roughly the same in both graphs. By comparison to the other phases, adding Ge to the Co does not influence the texture of the monosilicide significantly.

In-situ analysis was used primarily to determine the formation temperatures. It is clear from the comparison of FIGS. 2a–b that the inclusion of Ge into the cobalt pushed the $CoSi_2$ formation to higher temperature (by more than 100° C.). Although, a priori, it is not an advantage for chip processing to have to increase the thermal budget for silicide formation, the changes in diffusion kinetics (increase in Si diffusion) may reduce the interface roughness.

Figure 3:
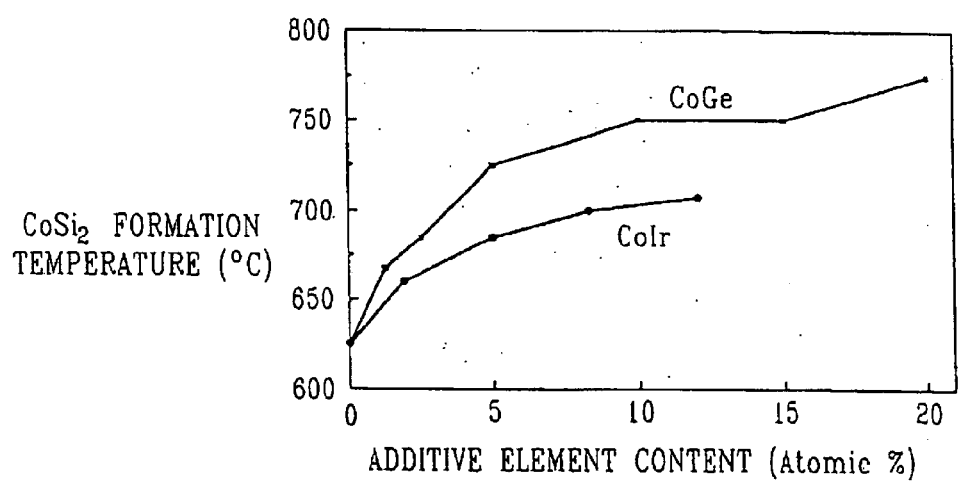
FIG. 3 is a graph of disilicide formation temperature for CoGe and CoIr as a function of Ge and Ir concentrations.

FIG. 3 shows that the increase in formation temperature for the $CoSi_2$ is monotonic with increasing Ge content. Similar behaviors have been observed with other elements such as iridium as are presented below.

Most of the elements studied tend to increase the $CoSi_2$ formation temperature to different extents but, as will be presented below, not all the elements investigated do so.

Figure 4B:
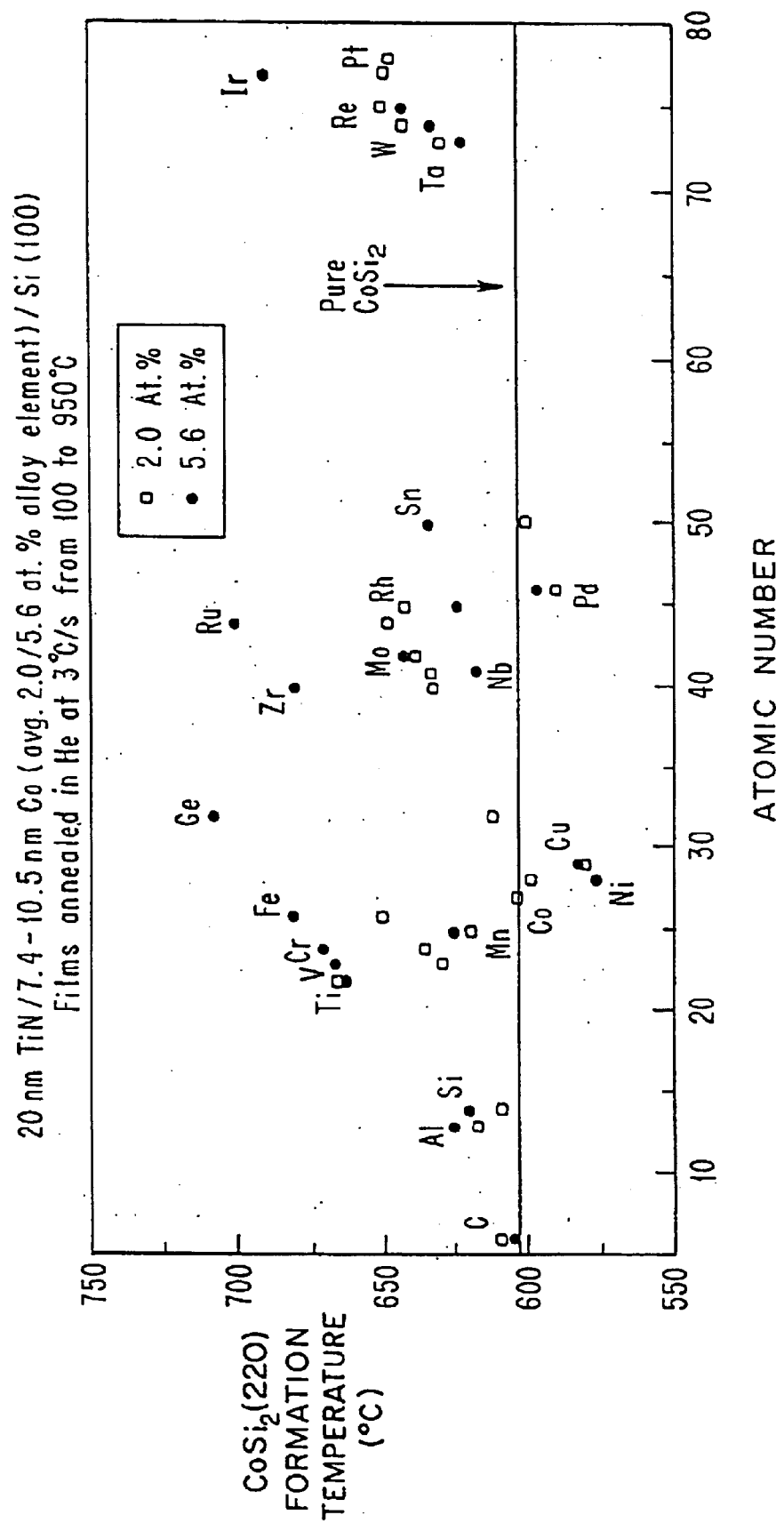

Formation Temperatures of Co Alloy Silicides Determined from In-situ XRD Measurements The formation temperature of cobalt monosilicide and disilicide for 23 of the studied alloys is shown in FIGS. 4a–b. The transformation temperatures are presented for both 2 atomic % and 5.6 atomic % alloys.

Note that the samples used here were deposited at a different time than the one used for FIGS. 2 and 3. The lower oxygen content of the later films explains the variation in formation temperatures (~20° C. for pure $CoSi_2$) between the two sets of figures.

For mono- and disilicides, most additive elements have a significant effect on the temperature of formation. The variations in temperatures are larger for the disilicide (~150° C.) then they are for the monosilicide (~100° C.). Although most elements increase the formation temperatures, in the case of the disilicide, some elements (Cu, Ni, Pd) reduce it.

Figure 6A:
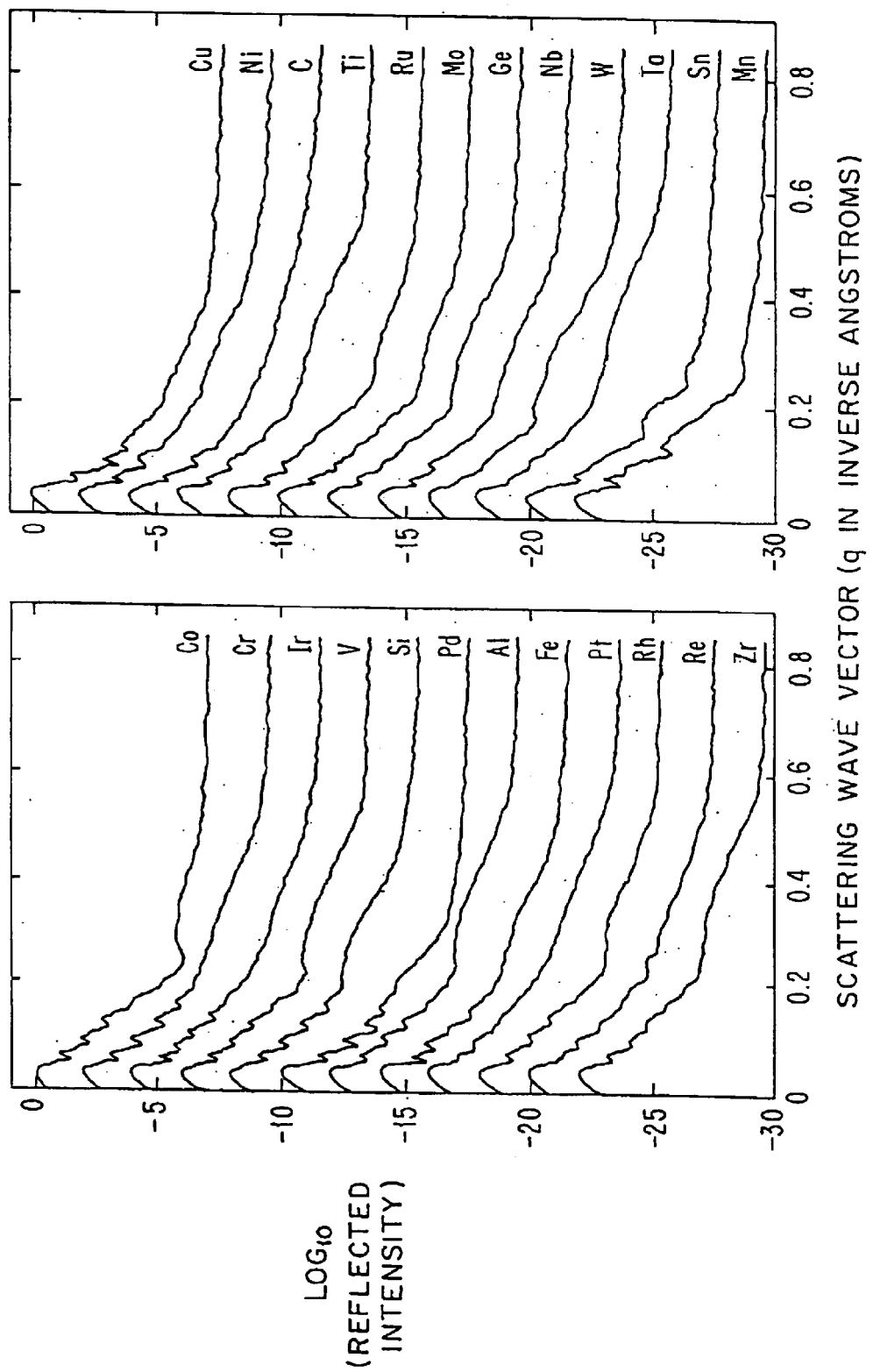
FIGS. 6a–b are graphs illustrating the grazing incidence X-ray reflectivity measurement of (a) Co alloy monosilicide; and (b) Co alloy disilicide at 5.6 atomic %.
Figure 6B:
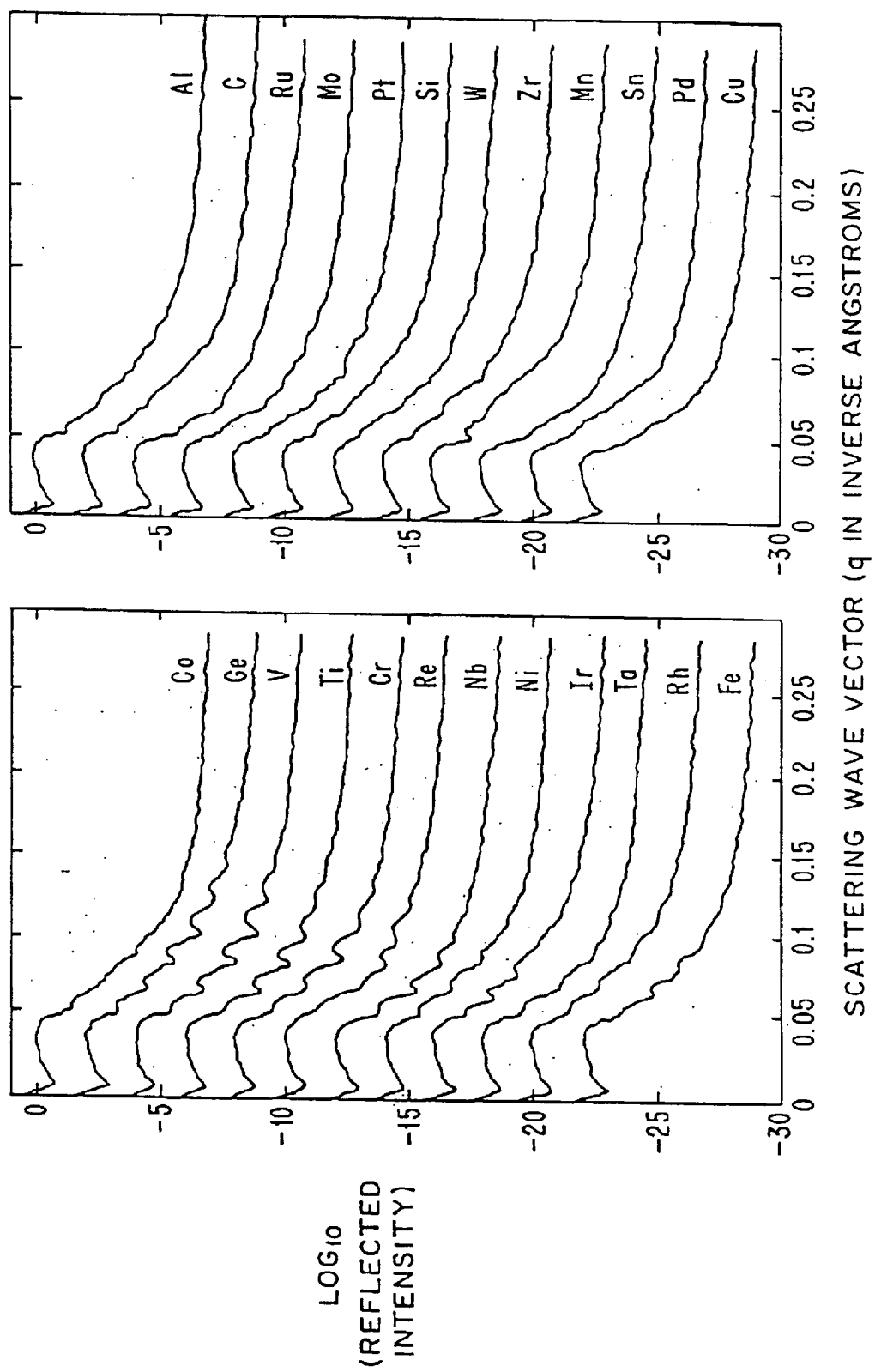

The in-situ results were used to determine the necessary conditions to form the monosilicide for each alloy (3° C./s ramp-rate from 535° C. to 620° C.). Once the alloy was in the CoSi phase, the TiN and the non-reacted Co were etched and then a 4 point probe resistivity measurement and grazing incidence x-ray reflectivity (GIXR) were performed. The samples were then annealed at a common higher temperature to form the cobalt disilicide. FIGS. 5 and 6 present the resistivity and the GIXR results, respectively.

One of the main conditions of using an alloyed material for silicidation is that the resistivity of the contact does not increase drastically. FIG. 5 shows the resistivity of the alloys in the monosilicide phase (a) and in the disilicide phase (b).

Most elements even at 5.6 atomic % concentration are within 30% of the original $CoSi_2$ resistivity value. It is interesting to point out that Ni and Ge are two elements which lead to lower resistivity even at 5.6 atomic %. These two alloys showed very different formation temperatures. The Co(5.6 at. % Ni)$Si_2$ was the easiest to form while the Co(5.6 at. % Ge) needed the highest formation temperature to form. This suggests that the mechanism that leads to low resistivity is very different in these cases.

Using razing Incidence X-ray Reflectivity (GIXR), all 23 alloys (at 5.6 atomic %) and the pure cobalt films both in the mono- and disilicide phases were investigated. In this measurement, a synchrotron x-ray beam measures the logarithmic decrease in the reflectivity signal above the critical angle for total external reflection. The period of the oscillations during the decay is a signature of the film thickness, while the amplitude and damping are signatures of the roughness both at the surface and the interfaces. In FIG. 6, the decay of the oscillations is directly linked with the interface roughness. The higher the number of oscillations, the smoother the film.

In FIG. 6, the y axis is the logarithm of the normalized measured intensity and the x axis represents the scattering vector (q) in inverse Angstroms ($Å^{-1}$). The scattering vector is simply $4\pi/\lambda *\sin(\theta)$. Since the angles here are small ($\theta<6°$), θ varies linearly with q and for the energy used here θ~7 q with θ in degrees and q in $Å^{-1}$. For the monosilicide, for q spanning from 0 to 0.85 $Å^{-1}$, the angle θ varies from 0 to 6 degrees. For the disilicide, the reflectivity dropped much faster, a sign of rougher surfaces and interfaces. For these samples, the reflectivity was then measured over a smaller q range (0 to 0.28 $Å^{-1}$), the θ angle varies in this case from 0 to 2 degrees only. For most of the monosilicide reflectivity curves, a fitted model allowed us to extract quantitative information about the interface between the monosilicide and the Si (100) substrate. These Root Mean Square (RMS) roughness varied from 11.5 Å to 22.5 Å. It is noted that the roughness is reported over a large area, also incorporating larger length roughness scale.

Table 1 shows the RMS roughness of the monosilicide alloys (5.6 atomic %) as determined by fitting the GIXR curves together with the measured resistivity of the cobalt monosilicide and disilicide for alloys of 2 atomic % and 5.6 atomic % concentration. These resistivity numbers are the same as the ones used in FIG. 5. The reflectivity curves of FIG. 6a have all been placed in order of roughness after the pure cobalt control, the smoothest sample being the first one. The last two samples (Sn and Mn) could not be fitted successfully due to their atypical shape.

The GIXR curves obtained on the disilicide samples (FIG. 6b) show larger differences with respect to the extent of the oscillations. In some samples, these oscillations persist at much larger q than for the pure cobalt silicide sample. All the curves have been qualitatively placed in order of "oscillation persistence". The sequence is clear at first for very well defined oscillations but later in the order, the irregularities in the oscillations makes it harder to sort. Since the diffuse background was not measured with enough resolution to allow for precise background substraction, the results of the fitting routine would not be meaningful. There are however clear differences between the cobalt and some alloys which seem to show a much smoother interface roughness.

TABLE 1

RMS roughness as determined by fitting the GIXR curves and resistivities of Co alloys.

| Co alloy | RMS roughness of MONO-SILICIDE alloys with 5.6 at. % from GIXR (Å) | monosilicide resistivity ($\mu$Ohms cm) | | Disilicide resistivity ($\mu$Ohms cm) | |
|---|---|---|---|---|---|
| | | 2 at. % | 5.6 at. % | 2 at. % | 5.6 at. % |
| Carbon | 16.5 | 418 | 398 | 22.5 | 22.1 |
| Aluminum | 13.5 | 238 | 297 | 19.4 | 21.9 |
| Silicon | 13 | 228 | 216 | 20.9 | 21.6 |
| Titanium | 17 | 389 | 240 | 27.6 | 22.9 |
| Vanadium | 12.5 | 241 | 229 | 23.8 | 32.3 |
| Chromium | 11.5 | 231 | 241 | 23.8 | 39.7 |
| Manganese | — | 379 | 258 | 22.8 | 26.4 |
| Iron | 13.5 | 258 | 260 | 22.5 | 39.9 |
| Cobalt | 13 | 234 | | 21.5 | |
| Nickel | 15.5 | 292 | 218 | 19.5 | 19.1 |
| Copper | 15.3 | 399 | 371 | 22.5 | 45.9 |
| Germanium | 18 | 206 | 272 | 20.3 | 19.4 |
| Zirconium | 15 | 238 | 231 | 17.4 | 23.2 |
| Niobium | 19.5 | 418 | 388 | 21.5 | 21.7 |
| Molybdenum | 17.5 | 263 | 272 | 20.0 | 22.5 |
| Ruthenium | 17 | 270 | 243 | 20.5 | 23.1 |
| Rhodium | 15 | 388 | 382 | 40.3 | 23.1 |
| Palladium | — | 195 | 184 | 38.6 | 26.2 |
| Tin | 22.5 | 386 | 394 | 22.4 | 29.6 |
| Tantalum | 20 | 238 | 250 | 18.7 | 22.6 |
| Tungsten | 20 | 245 | 267 | 20.6 | 23.3 |
| Rhenium | 15 | 476 | 507 | 20.4 | 23.50 |
| Iridium | 12.5 | 265 | 262 | 20.4 | 25.2 |
| Platinum | 14.5 | 199 | 199 | 21.8 | 26.6 |

To verify first the quantitative results obtained on the monosilicide by GIXR, three samples were selected that exhibit different interface roughness. The CoCr alloy showed a smoother interface (11.5 Å) than the pure cobalt (13.5 Å) while the CoNb was considerably rougher (19.5 Å). These three samples are shown in the above table. Note that the Cr addition (at 5.6 at. %) leads to a large rise in the resistivity of the disilicide. Images from the cross sectional transmission electron microscopy (TEM) confirm the above results.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated but fall within the scope of the appended claims.

Having thus described our invention in detail, what we claim as new and desire to secure by the Letters Patent is:

1. A method of forming an electrical contact to a silicon-containing substrate comprising the steps of:

forming an alloy layer having the formula CoX over a silicon-containing substrate, where X is an alloying additive;

first annealing the alloy layer at a temperature sufficient to form a Co alloy suicide, CoXSi, layer;

removing any alloy layer; and second annealing said Co alloy silicide layer at a temperature that converts the CoXSi layer into a Co alloy disilicide, $CoXSi_2$, layer.

2. The method of claim 1 further comprising forming a barrier layer over said alloy layer prior to said first annealing step, wherein said barrier layer is removed by said removing step.

3. The method of claim 2 wherein said barrier layer is composed of TiN.

4. The method of claim 1 wherein said alloying additive is selected from the group consisting of C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu, and mixtures thereof.

5. The method of claim 4 wherein said alloying additive is C, Al, Si, Sc, Ti, Cr, Mn, Fe, Co, Ni, Cu, Ge, Y, Zr, Nb, Mo, Ru, Rh, Pd, In, Sn, a, Hf, Ta, W, Re, Ir or Pt.

6. The method of claim 1 wherein said alloying additive is present in said alloy layer in an amount of from about 0.01 to about 50 atomic percent.

7. The method of claim 6 wherein said alloying additive is present in said alloy layer in an amount of from about 0.1 to about 20 atomic %.

8. The method of claim 1 wherein said silicon-containing substrate comprises a single crystal Si, polycrystalline Si, SiGe, amorphous Si, or a silicon-on-insulator.

9. The method of claim 1 further comprising preannealing the alloy layer prior to said first annealing step at a temperature sufficient to form a Co rich alloy silicide, $Co_2XSi$, layer.

* * * * *

UNITED STATES PATENT AND TRADEMARK OFFICE
CERTIFICATE OF CORRECTION

PATENT NO. : 6,809,030 B2
DATED : October 26, 2004
INVENTOR(S) : Paul D. Agnello et al.

It is certified that error appears in the above-identified patent and that said Letters Patent is hereby corrected as shown below:

<u>Column 10,</u>
Line 33, "Ti, Cr" should read -- Ti,V,Cr --

Signed and Sealed this

Fourteenth Day of June, 2005

JON W. DUDAS
*Director of the United States Patent and Trademark Office*